United States Patent
Muraki et al.

(10) Patent No.: US 7,230,252 B2
(45) Date of Patent: Jun. 12, 2007

(54) ABERRATION ADJUSTING METHOD, DEVICE FABRICATION METHOD, AND CHARGED PARTICLE BEAM LITHOGRAPHY MACHINE

(75) Inventors: Masato Muraki, Inagi (JP); Hiroya Ohta, Kodaira (JP)

(73) Assignees: Canon Kabushiki Kaisha, Tokyo (JP); Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 11/337,444

(22) Filed: Jan. 24, 2006

(65) Prior Publication Data
US 2006/0169927 A1 Aug. 3, 2006

(30) Foreign Application Priority Data
Jan. 26, 2005 (JP) ............................. 2005-018284

(51) Int. Cl.
  *H01J 37/42* (2006.01)
(52) U.S. Cl. .............................. 250/396 R; 250/492.23
(58) Field of Classification Search ........... 250/492.22, 250/492.23, 398, 396 R
See application file for complete search history.

(56) References Cited

U.S. PATENT DOCUMENTS

| | | | |
|---|---|---|---|
| 5,834,783 A | 11/1998 | Muraki et al. ............... 250/398 |
| 5,973,332 A | 10/1999 | Muraki et al. ........... 250/492.2 |
| 6,037,601 A * | 3/2000 | Okunuki ................ 250/492.23 |
| 6,166,387 A | 12/2000 | Muraki et al. ........... 250/492.2 |
| 6,323,499 B1 | 11/2001 | Muraki et al. ......... 250/492.22 |
| 6,982,427 B2 * | 1/2006 | Kawasaki et al. ...... 250/396 R |

FOREIGN PATENT DOCUMENTS

| JP | 9-245708 | 9/1997 |
|---|---|---|
| JP | 2004-153245 | 5/2004 |

* cited by examiner

*Primary Examiner*—Kiet T. Nguyen
(74) *Attorney, Agent, or Firm*—Fitzpatrick, Cella, Harper & Scinto

(57) ABSTRACT

An aberration adjusting method of a charged particle beam optical system. The method includes an aberration measuring step of measuring N aberrations of the charged particle beam optical system, an aberration sensitivity acquiring step of changing M control amounts to control optical elements included in the charged particle beam optical system, obtaining variations of the N aberrations by executing the aberration measuring step, and obtaining aberration sensitivities of the M control amounts. The method further includes a control amount deciding step of deciding the M control amounts on the basis of the N aberrations and the aberration sensitivities of the M control amounts to set the N aberrations to target aberrations. The aberration is a displacement of each image height of charged particles beams. The control amount is an amount for controlling a position of the charged particle beams, and M<N, in which M and N are positive integers.

8 Claims, 14 Drawing Sheets

ABERRATION ADJUSTING METHOD, DEVICE FABRICATION METHOD, AND CHARGED PARTICLE BEAM LITHOGRAPHY MACHINE

FIELD OF THE INVENTION

The present invention relates to an aberration measuring instrument for a charged particle beam optical system, an aberration adjusting method of a charged particle beam optical system in a charged particle beam lithography machine, such as an electron beam lithography machine or an ion beam lithography machine, which has the aberration measuring instrument, and is mainly used for exposure of a semiconductor integrated circuit, a device fabrication method using the aberration adjusting method, a charged particle beam lithography machine using the aberration adjusting method, and a device fabrication method using the charged particle beam lithography machine.

BACKGROUND OF THE INVENTION

Conventional electron beam lithography machines include machines of a point beam type, which use a spot-shaped beam and machines of a variable rectangular beam type, which use a beam having a rectangular section with a variable size.

An electron beam lithography machine of a point beam type performs drawing by using a single electron beam. Hence, this machine has a low throughput and is used only for research and development. The throughput of an electron beam lithography machine of a variable rectangular beam type is higher than that of a point beam type by one or two orders of magnitude. However, this type also basically executes drawing by using a single electron beam, so there is still a problem of throughput in exposing a pattern in which fine patterns of about 01. μm are integrated at a high density.

As a machine to solve this problem, there is an electron beam lithography machine of a stencil mask type. In this machine, a pattern to be drawn is formed as pattern conduction pores in a stencil mask. Then, the pattern to be drawn is transferred to the sample surface through a reduced electron optical system by irradiating the stencil mask with an electron beam. As another method, a multi-electron beam lithography machine is used. A substrate having a plurality of apertures is irradiated with an electron beam to irradiate a sample surface with a plurality of electron beams from the plurality of apertures through a reduced electron optical system. The sample surface is scanned by deflecting the plurality of electron beams. The plurality of electron beams are individually turned on/off in accordance with the pattern to be drawn, thereby drawing the pattern. In all methods described above, the throughput can be improved because the area to be exposed at once, i.e., the exposure area, is wider than a conventional one.

The reduced electron optical system of an electron beam lithography machine of a stencil mask type or a multi-electron beam lithography machine must be adjusted to suppress aberration in balance in the entire exposure field wider than usual. To do this, it is necessary to separately measure spherical aberration, coma, astigmatism, displacement, and focus position at each image height in the entire exposure field and execute adjustment on the basis of the measurement result. However, in conventional aberration measurement, defocus of a beam and its position are only measured so aberration cannot be suppressed in balance in the entire exposure field.

Japanese Patent Laid-Open No. 2004-153245 (patent reference 1) proposes an astigmatism correction sensitivity deciding method in a charged particle beam lithography machine and an exposure method using the method.

SUMMARY OF THE INVENTION

It is an aspect of the present invention to provide an aberration adjusting method capable of adjusting in balance aberration in the effective field of the charged particle beam optical system in a lithography machine.

It is another aspect of the present invention to provide a device fabrication method capable of fabricating a highly integrated semiconductor device at a low cost by using the aberration adjusting method.

It is still another aspect of the present invention to provide a charged particle beam lithography machine capable of adjusting in balance aberration in the effective field of the charged particle beam optical system by using the aberration adjusting method.

It is still another aspect of the present invention to provide a device fabrication method capable of fabricating a highly integrated semiconductor device at a low cost by using the charged particle beam lithography machine.

In order to achieve the above-described aspects, the first aberration adjusting method of the present invention is an aberration adjusting method of a charged particle beam optical system in a lithography machine, and comprises:

an aberration measuring step of measuring N aberrations of the charged particle beam optical system;

an aberration sensitivity acquiring step of changing M control amounts to control optical elements included in the charged particle beam optical system, obtaining variations of the N aberrations by executing the aberration measuring step, and obtaining aberration sensitivities of the M control amounts; and a control amount deciding step of deciding the M control amounts on the basis of the N aberrations and the aberration sensitivities of the M control amounts to set the N aberrations to target aberrations, wherein M<N.

The second aberration adjusting method of the present invention further comprises an aberration confirming step of executing the aberration measuring step again after the control amounts decided in the control amount deciding step are set in the optical elements.

In the third aberration adjusting method of the present invention, if the aberrations do not satisfy allowances in the aberration confirming step, the aberration sensitivity acquiring step, the control amount deciding step, and the aberration confirming step are executed again.

In the fourth aberration adjusting method of the present invention, the aberration is represented by a Zernike coefficient.

In the fifth aberration adjusting method of the present invention, the aberration is a displacement of each image height.

In the sixth aberration adjusting method of the present invention, in the control amount deciding step, suppose that Ci is the aberration, CTi is the target aberration, and Ti is the allowance, a residual function ei after adjustment is defined by $ei=(Ci-CTi)/Ti$ to minimize a maximum absolute value of the residual function ei after adjustment (i=1, ..., n), a dummy variable T(|ei|)<T (i=1, ..., n)) is introduced, formulation to a linear programming problem to minimize the dummy variable T is executed, and on the basis of the aberration sensitivity, the control amounts to control the optical elements are decided.

In a device fabrication method of the present invention, a device is fabricated by using the aberration adjusting method.

A charged particle beam lithography machine of the present invention is a charged particle beam lithography machine for exposing a substrate through a charged particle beam optical system, and comprises:

an aberration measuring unit adapted to measure N aberrations of the charged particle beam optical system;

an aberration sensitivity acquiring unit adapted to change M control amounts to control optical elements included in the charged particle beam optical system, to obtain variations of the N aberrations by using the aberration measuring unit, and to obtain aberration sensitivities of the M control amounts; and a control amount deciding unit adapted to decide the M control amounts on the basis of the N aberrations and the aberration sensitivities of the M control amounts to set the N aberrations to target aberrations, wherein M<N.

A device fabrication method of the present invention comprises steps of exposing a target exposure substrate by using the charged particle beam lithography machine and developing the exposed substrate.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

The present invention will be described below on the basis of embodiments with reference to the accompanying drawings.

As an example of a charged particle beam lithography machine to which the aberration adjusting method of the charged particle beam optical system in a lithography machine according to an embodiment of the present invention is applied, an electron beam lithography machine will be described. However, the present invention can also be applied to a lithography machine using not an electron beam, but an ion beam.

First Embodiment

Figure 1:
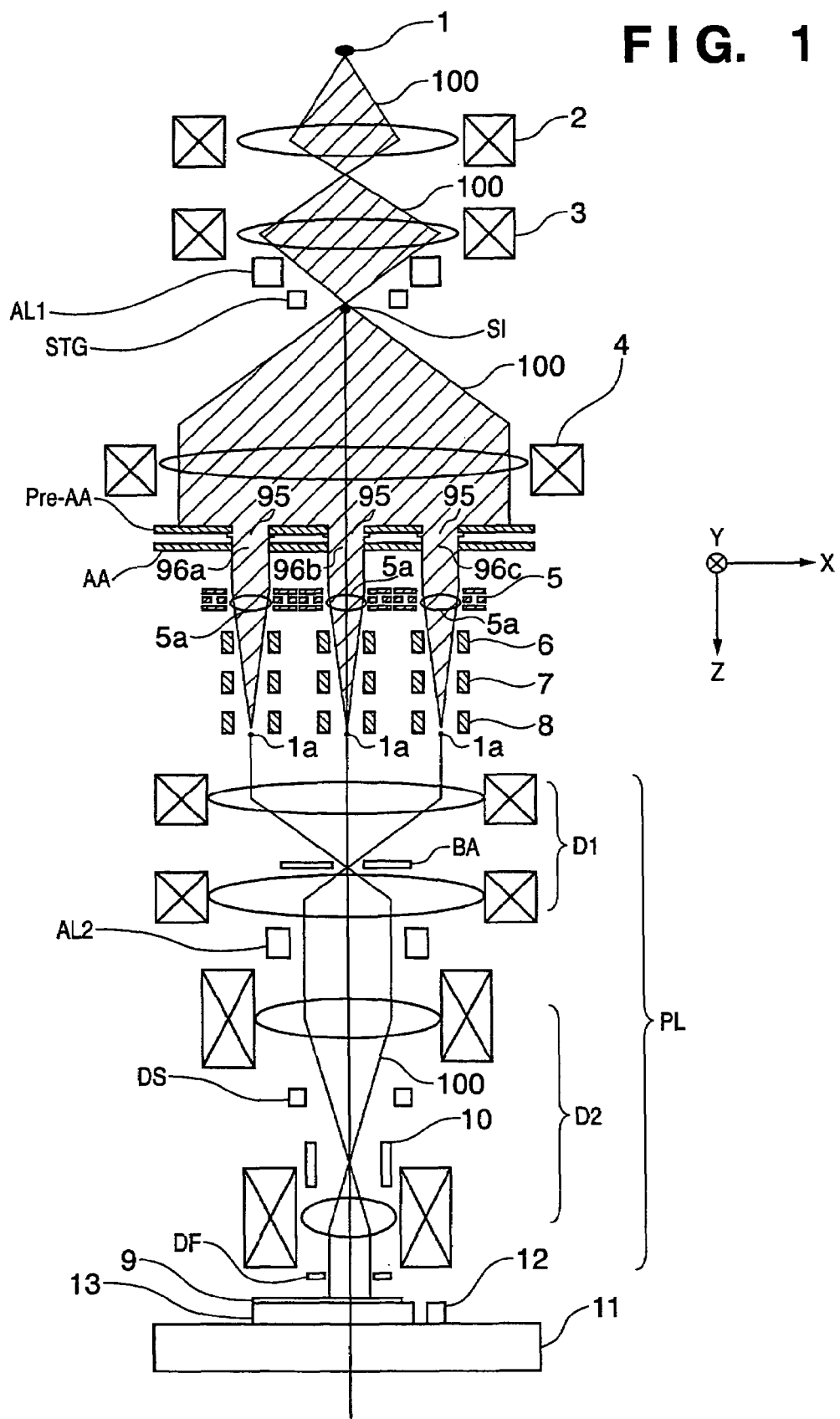
FIG. 1 is a schematic view showing the main part of an electron beam lithography machine to which the aberration adjusting method of the charged particle beam optical system in a lithography machine according to an embodiment of the present invention is applied.

The constituent elements and drawing method of an electron beam lithography machine to which the aberration adjusting method of the charged particle beam optical system in a lithography machine according to the first embodiment of the present invention is applied will be described first. FIG. 1 is a schematic view showing the main part of the electron beam lithography machine to which the aberration adjusting method of the charged particle beam optical system in the lithography machine according to the first embodiment of the present invention is applied. An electron beam generated by an electron gun (not shown) forms an electron source 1 as a cross-over image. An electron beam 100 emitted from the electron source 1 forms an image SI of the electron source 1 through beam shaping optical systems 2 and 3. The size of the image SI of the electron source 1 can be changed by adjusting the lens power of each of the beam shaping optical systems 2 and 3. The electron beam 100 radiated from the image SI is changed to an almost parallel electron beam 100 through a collimating lens 4. An aperture array AA is formed by two-dimensionally arraying apertures 96a, 96b, and 96c. A pre-aperture array Pre-AA is formed by two-dimensionally arraying apertures 95 larger than the apertures 96a, 96b, and 96c of the aperture array AA in the same pattern as that of the aperture array AA. This structure reduces thermal damage to the aperture array AA by electron beam irradiation. A lens array 5 is formed by two-dimensionally arraying electrostatic lenses 5a having the same optical power. Each of deflector arrays 6 and 7 is formed by two-dimensionally arraying individually drivable eight-pole electrostatic deflectors. A blanker array 8 is formed by two-dimensionally arraying individually drivable electrostatic blankers. The substantially parallel electron beam 100 from the collimating lens 4 is divided into a plurality of electron beams 100 by the aperture array AA. Each of the divided electron beams 100 forms an intermediate image 1a of the electron source 1 on a corresponding blanker of the blanker array 8 through a corresponding electrostatic lens 5a of the lens array 5. The pupil of each electrostatic lens 5a of the lens array 5 corresponds to one of the apertures of the aperture array AA.

A reduced optical projecting system PL, including two stages of symmetric magnetic doublet lenses D1 and D2 is provided downstream of the plane of the intermediate image 1a to project a plurality of intermediate images 1a onto a wafer 9. The pupil of the reduced projecting system PL and the aperture of the aperture array AA have a conjugated relation.

The deflector arrays 6 and 7 can individually adjust the positions (positions in a plane perpendicular to the optical axis) of the intermediate images 1a of the electron source 1, which are formed on the blanker array 8. The positions of the plurality of intermediate images 1a of the electron source 1 can be adjusted symmetrically by excitation of the collimating lens 4 or a Stig meter STG arranged near the light source image SI. When the blanker array 8 deflects the electron beam 100, they are shielded by a blanking aperture BA so that irradiation of the wafer 9 with the electron beams 100 can be controlled. In the doublet lens D2 of the lower stage, a deflector 10 to simultaneously displace the plurality of electron beams 100 to desired positions in the X and Y directions, a Stig meter DS serving as an eight-pole electrostatic Stig meter to simultaneously adjust the astigmatism of the plurality of electron beams 100, and a focus coil DF to simultaneously adjust the focus of the plurality of electron beams 100, are arranged. A first aligner AL1, serving as an optical axis adjusting aligner, is arranged between the beam shaping optical system 3 and the collimating lens 4. A second aligner AL2, serving a an optical axis adjusting aligner, is arranged between the doublet lenses D1 and D2. An X-Y stage 11 having the wafer 9 thereon is designed to be movable in the X and Y directions perpendicular to the optical axis. An electrostatic chuck 13 to fix the wafer 9 and a semiconductor detector 12 having an aperture pattern on the incident side of the electron beams 100 to measure the positions of the electron beams 100 are arranged on the X-Y stage 11.

The system configuration of the electron beam lithography machine to which the aberration adjusting method of the charged particle beam optical system in the lithography machine according to the first embodiment of the present invention is applied will be described below with reference to FIG. 2.

A lens control circuit 21 controls the electrooptic power (focal lengths) of each of the beam shaping optical systems 2 and 3, collimating lens 4, lens array 5, and symmetric magnet doublet lenses D1 and D2. A blanking control circuit 22 individually controls the plurality of blankers of the blanker array 8. A deflector control circuit 23 controls the main deflector 10. An aberration compensating circuit 24 adjusts generated aberration by controlling the deflector arrays 6 and 7, Stig meter DS, and focus coil DF. An aligner control circuit 25 controls the aligners AL1 and AL2 to adjust the optical axis. A detecting circuit 26 processes a signal from the semiconductor detector 12. A stage control circuit 27 drives and controls the X-Y stage 11 together with a laser interferometer (not shown) to detect the position of the X-Y stage 11. An AA moving circuit 28 switches the horizontal position of the aperture array AA. A main controller 29 controls the plurality of control circuits described above and manages the entire electron beam lithography machine.

A drawing method applied to the aberration adjusting method of the charged particle beam optical system in the lithography machine according to the first embodiment of the present invention will be described next with reference to FIGS. 1 and 2, and particularly, FIG. 3. The main controller 29 instructs the blanking control circuit 22 and deflector control circuit 23 on the basis of exposure control data to cause the deflector 10 to deflect the plurality of electron beams 100. Simultaneously, the main controller 29 individually turns on/off the blankers of the blanker array 8 in accordance with pixels 101 to be exposed to the wafer 9.

Figure 3:
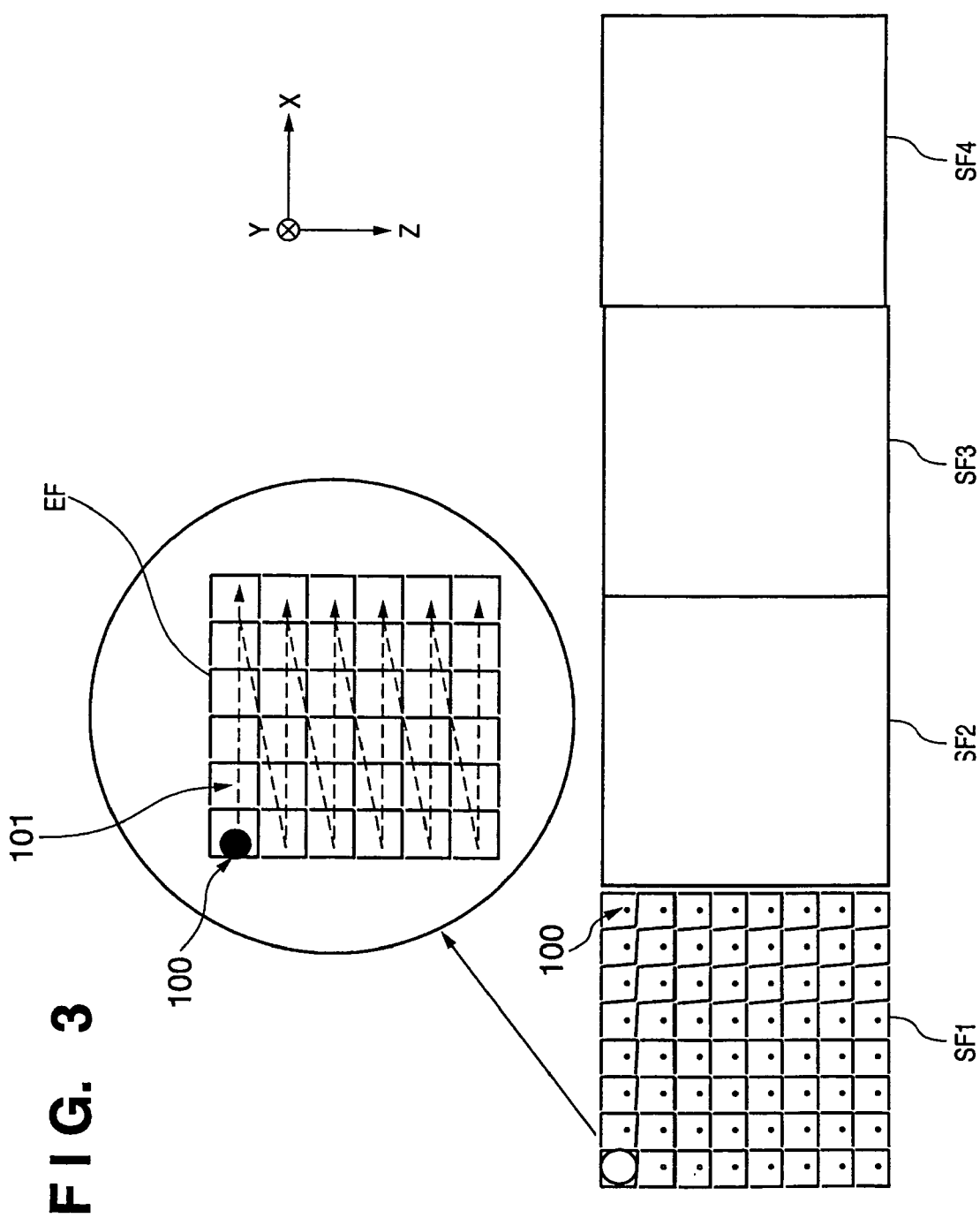
FIG. 3 is an explanatory view of a drawing method by the electron beam lithography machine to which the aberration adjusting method of the charged particle beam optical system in the lithography machine according to the embodiment of the present invention is applied.

Each electron beam 100 raster-scan-exposes a corresponding unit exposure field (EF) on the wafer 9, as shown in FIG. 3. The unit exposure fields (EF) of the electron beams 100 are set to be two-dimensionally adjacent to each other. As a result, a sub field (SF), including a plurality of unit exposure fields (EF) exposed simultaneously, is exposed. After sub field 1 (SF1) is exposed, the main controller 29 causes the deflector 10 to deflect the plurality of electron beams 100 to the next sub field 2 (SF2) to expose it.

An aberration adjusting method of a charged particle beam optical system in a lithography machine according to the first embodiment of the present invention comprises:

an aberration measuring step of measuring N aberrations of the charged particle beam optical system;

an aberration sensitivity acquiring step of changing M control amounts to control optical elements included in the charged particle beam optical system, obtaining variations of the N aberrations by executing the aberration measuring step, and obtaining aberration sensitivities of the M control amounts; and a control amount deciding step of deciding the M control amounts on the basis of the N aberrations and the aberration sensitivities of the M control amounts to set the N aberrations to target aberrations, wherein M<N.

The aberration adjusting method of the charged particle beam optical system in the lithography machine according to the first embodiment of the present invention further comprises an aberration confirming step of executing the aberration measuring step again after the control amounts decided in the control amount deciding step are set in the optical elements.

In the aberration adjusting method of the charged particle beam optical system in the lithography machine according to the first embodiment of the present invention, if the aberrations do not satisfy allowances in the aberration confirming step, the aberration sensitivity acquiring step, the control amount deciding step, and the aberration confirming step are executed again.

In the aberration adjusting method of the charged particle beam optical system in the lithography machine according to the first embodiment of the present invention, the aberration is represented by a Zernike coefficient.

In the aberration adjusting method of the charged particle beam optical system in the lithography machine according to the first embodiment of the present invention, the aberration is a displacement of each image height.

In the aberration adjusting method of the charged particle beam optical system in the lithography machine according to the first embodiment of the present invention, in the control amount deciding step, suppose that Ci is the aberration, CTi is the target aberration, and Ti is the allowance, a residual function ei after adjustment is defined by ei=(Ci−CTi/Ti, to minimize a maximum absolute value of the residual function ei after adjustment (i=1, . . . , n), a dummy variable T(|ei|)<T (i=1, . . . , n)) is introduced, formulation to a linear programming problem to minimize the dummy variable T is executed, and, on the basis of the aberration sensitivity, the control amounts to control the optical elements are decided.

Figure 4:
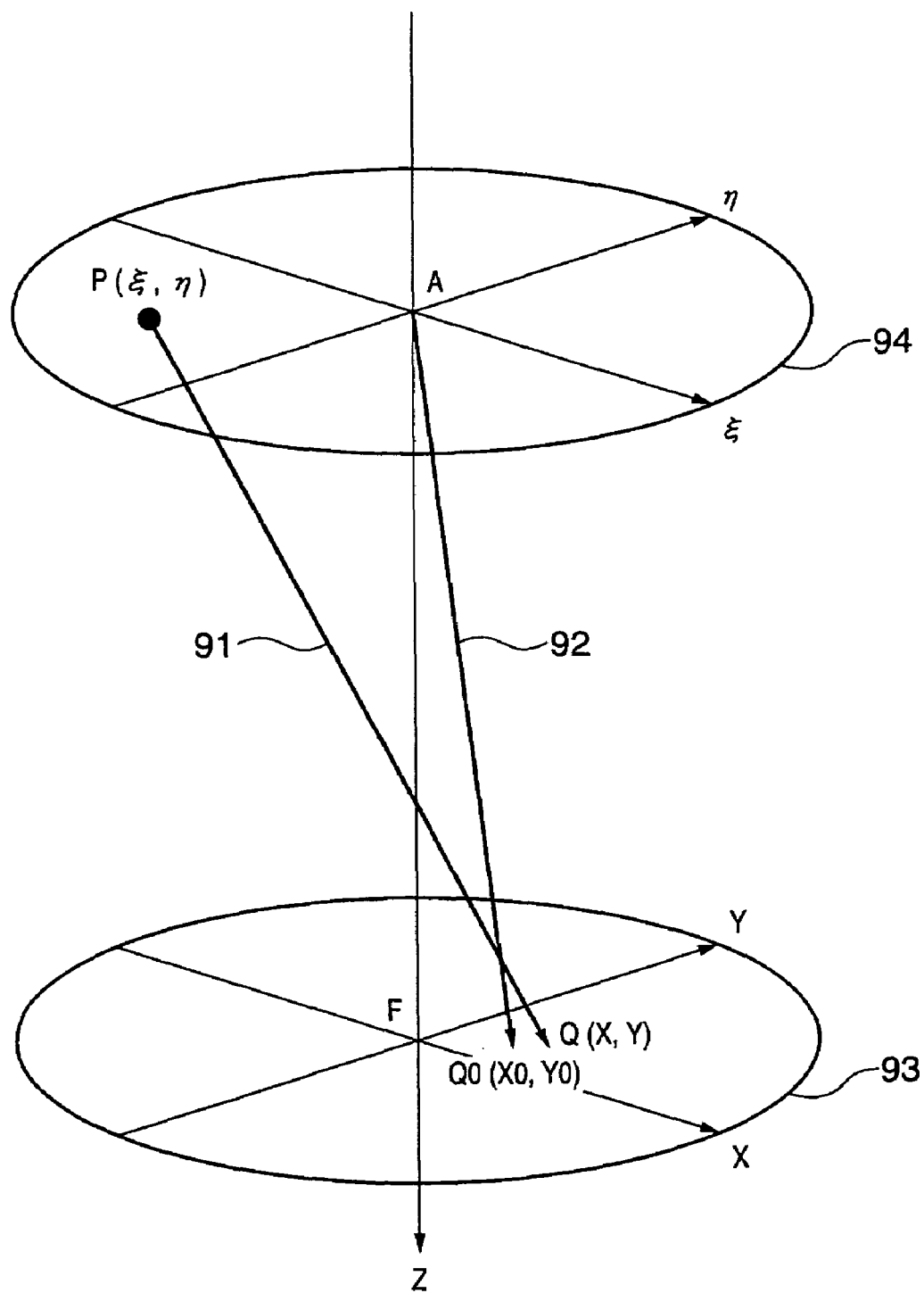
FIG. 4 is an explanatory view of geometrical aberration by the electron beam lithography machine to which the aberration adjusting method of the charged particle beam optical system in the lithography machine according to the embodiment of the present invention is applied.

Aberration measurement of the aberration adjusting method of the charged particle beam optical system in the lithography machine according to the first embodiment of the present invention will be described next with reference to FIG. 4.

A point A is defined as the central point of an exit pupil 94. A point F is defined as a Gaussian image point. A plane perpendicular to the optical axis passing through the point F is defined as an image plane 93. X- and Y-axes are set on the image plane 93. The intersection between the image plane 93 and a principal ray 92 passing through the point A is defined as Q0(X0, Y0). Supposing that Q is the point where a beam 91 that has exited from an arbitrary point P on the plane of the exit pupil 94 crosses the image plane 93, geometrical aberration of the point P with respect to Q0 (image height) is represented by Q−Q0(δX, δY). The geometrical aberration is given by $$\sigma X = \frac{\partial W(\rho, \theta)}{\partial \xi} \qquad (1\text{-}1)$$

$$\sigma Y = \frac{\partial W(\rho, \theta)}{\partial \eta} \qquad (1\text{-}2)$$

wherein, $W(\rho, \theta) = \sum_n CnZn(\rho, \theta)$ $(\xi = \rho\cos\theta, \eta = \rho\sin\theta)$ wherein $W(\rho, \theta)$ is wave aberration expressed by a Zernike polynomial.

Basic matters of expression by Zernike polynomials will be described.

In the expression by Zernike polynomials, a polar coordinate system is used as a coordinate system, and a Zernike cylindrical function is used as an orthogonal system. In this case, $\rho$ is a normalized pupil radius obtained by normalizing the radius of the exit pupil to 1, $\theta$ is the radius angle of the polar coordinates, and Cn is an expansion coefficient.

Table 1 shows, of a Zernike cylindrical system $Zn(\rho, \theta)$, cylindrical functions Z1 to Z16 of the first to 16th terms and aberration of each term.

TABLE 1

| Expansion Coefficient | Cylindrical Function | Aberration |
|---|---|---|
| C1 | 1 | constant term |
| C2 | $\rho\cos\theta$ | distortion |
| C3 | $\rho\sin\theta$ | distortion |
| C4 | $2\rho^2 - 1$ | defocus |
| C5 | $\rho^2\cos2\theta$ | astigma |
| C6 | $\rho^2\sin2\theta$ | astigma |
| C7 | $(3\rho^2 - 2)\rho\cos\theta$ | coma |
| C8 | $(3\rho^2 - 2)\rho\sin\theta$ | coma |
| C9 | $6\rho^4 - 6\rho^2 + 1$ | spherical |
| C10 | $\rho^2\cos3\theta$ | trefoil |
| C11 | $\rho^2\sin3\theta$ | trefoil |
| C12 | $(4\rho^4 - 3\rho^2)\cos2\theta$ | astigma |
| C13 | $(4\rho^4 - 3\rho^2)\sin2\theta$ | astigma |
| C14 | $(10\rho^5 - 12\rho^3 + 3\rho)\cos\theta$ | coma |
| C15 | $(10\rho^5 - 12\rho^3 + 3\rho)\sin\theta$ | coma |
| C16 | $20\rho^6 - 30\rho^4 + 12\rho^2 + 1$ | spherical |

To measure aberration, an aperture to pass only specified beams is formed in the exit pupil plane. The displacement between the Gaussian image point and the image of the beam on the image plane is measured. The displacement is measured by sequentially changing the location of the specified beam on the exit pupil plane. The expansion coefficient Cn of each term is obtained by fitting the Zernike cylindrical system $Zn(\rho, \theta)$ to the displacement information. The wave aberration $W(\rho, \theta)$ can finally be obtained by using the expansion coefficient Cn and Zernike cylindrical system $Zn(\rho, \sigma)$.

The aberration measurement step of the aberration adjusting method of the charged particle beam optical system in the lithography machine according to the first embodiment of the present invention will be described next with reference to FIG. 5.

Figure 5:
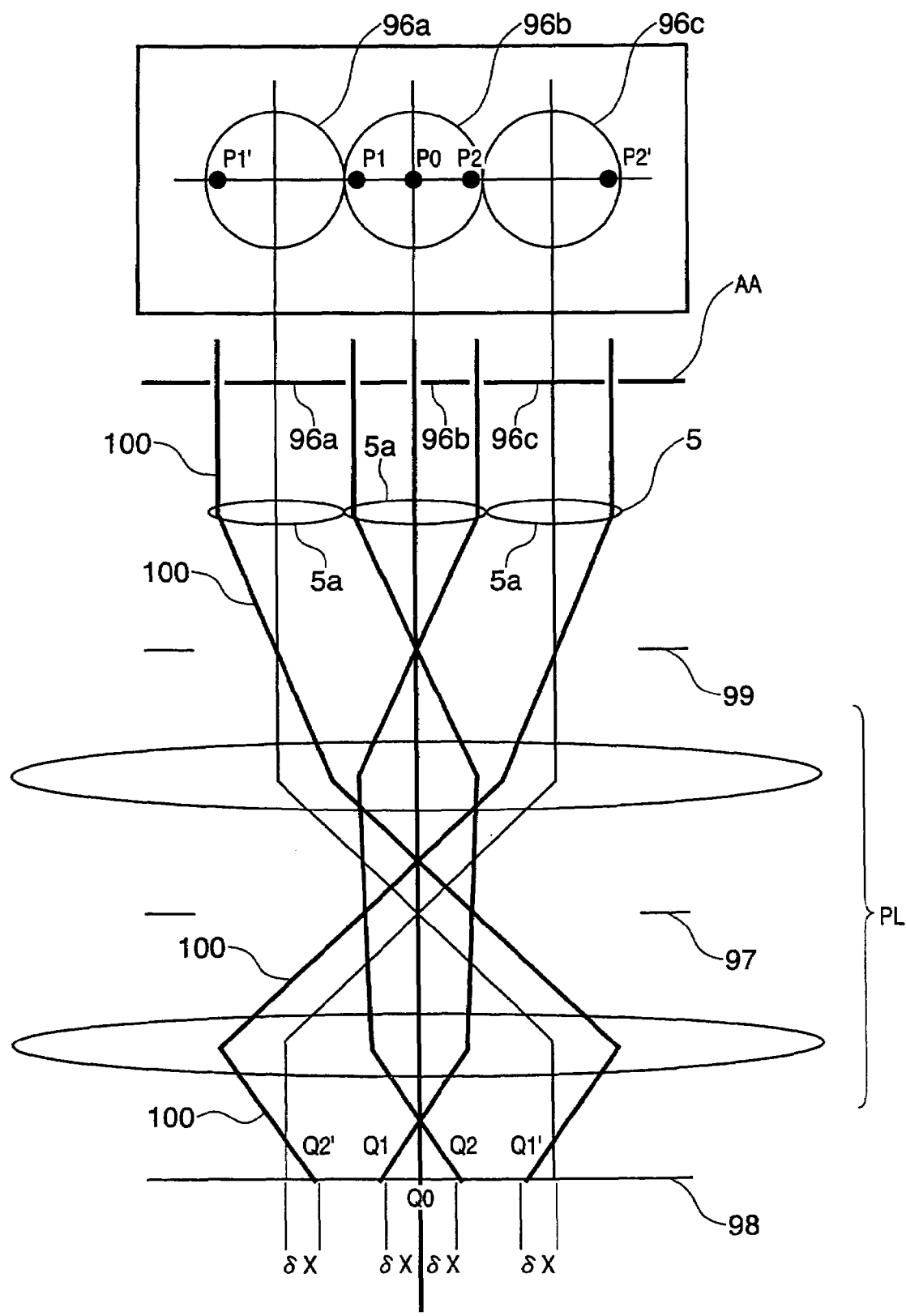
FIG. 5 is a view for explaining aberration measurement by the electron beam lithography machine to which the aberration adjusting method of the charged particle beam optical system in the lithography machine according to the embodiment of the present invention is applied.

FIG. 5 simplifies the optical system shown in FIG. 1 for descriptive convenience. The same reference numerals as those in FIG. 1 denote constituent elements with the same functions as those in FIG. 5.

The almost parallel electron beam from the optical system (not shown) is divided into the plurality of electron beams 100 by the aperture array AA. The divided electron beams 100 form the intermediate images 1a on an object plane 99 of the reduced optical projection system PL. The intermediate images 1a are projected to an image plane 98 through the reduced optical projecting system PL. At this time, the apertures 96a, 96b, and 96c of the aperture array AA correspond to an exit pupil 97. The apertures 96a, 96b, and 96c of the aperture array AA in exposure are shown. In aberration measurement, as described above, an aperture to pass only specified beams must be formed in the plane of the exit pupil 97. An aperture to pass only beams from P0, P1, and P2 in the aperture 96 corresponding to the plane of the exit pupil 97 is provided. When the positions Q0, Q1, and Q2 of the beams on the image plane 98 are measured, and δX1 and δX2 are measured, aberration is obtained. However, if aberration is small, Q0, Q1, and Q2 are separate and difficult to measure. An aperture to pass only a beam from, not P1, but position P1' corresponding to P1 in the aperture 96a as the next exit pupil plane, is provided. Similarly, an aperture to pass only a beam from, not P2, but a position P2' corresponding to P2 in the aperture 96c as the next plane of the exit pupil 97 is provided. The beams from the apertures 96a, 96b, and 96c are regarded as beams with the same image height (i.e., same aberration). Positions Q1' and Q2' of the beams from the positions P1' and P2' on the image plane are measured, and the displacements δX1 and δX2 from the Gaussian image point are measured. Even when aberration is small, the positions Q1' and Q2' of the beams on the image plane can be separated. Hence, even small aberration can be measured.

The aperture array AA applied to the aberration adjusting method of the charged particle beam optical system in the lithography machine according to the first embodiment of the present invention will be described next with reference to FIGS. 6A and 6B.

Figure 6A:
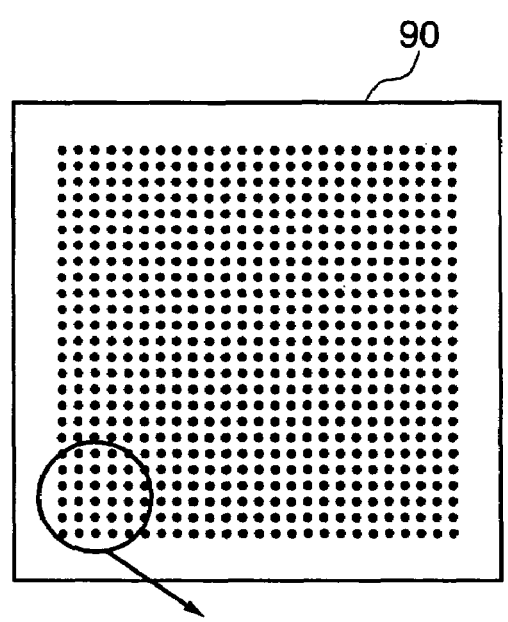
FIG. 6A is an explanatory view of an aperture pattern for exposure in the aperture array of the electron beam lithography machine to which the aberration adjusting method of the charged particle beam optical system in the lithography machine according to the embodiment of the present invention is applied.
Figure 6A:
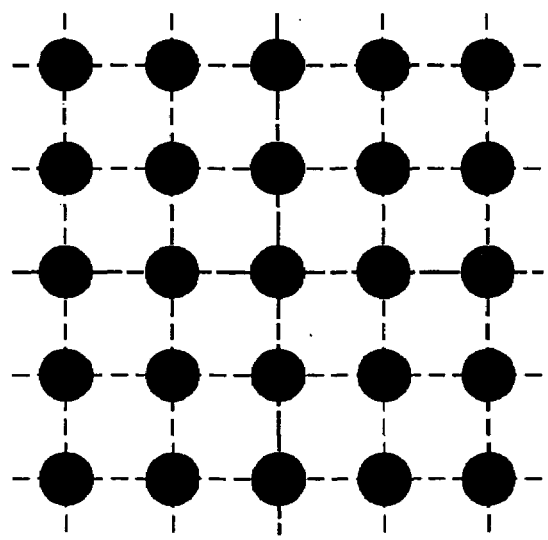

FIG. 6A shows the aperture pattern for exposure of the aperture array AA. FIG. 6B shows the aperture pattern for aberration measurement.

An aperture pattern 90 for exposure shown in FIG. 6A is segmented into 5×5=25 blocks. An aperture pattern 89 for aberration measurement shown in FIG. 6B, which corresponds to the central aperture pattern, has the same apertures. In nine of the twenty-five blocks, the aperture pattern 89 for aberration measurement corresponding to the aperture pattern 90 for exposure has small apertures to pass only specified beams (corresponding to exit pupil positions ξ and η) in the aperture pattern 90 for exposure. In these nine blocks, beams in the same block are regarded to have the same image height, and the image height at the block center is defined as a representative image height, as shown in FIGS. 6A and 6B. Aberration is measured in the above-described way. The remaining blocks have only the aperture pattern 89 for aberration measurement corresponding to the aperture pattern at the block center. Beams which pass for distortion measurement are set, as will be described later. In other words, a block indicates an image height.

Figure 6B:
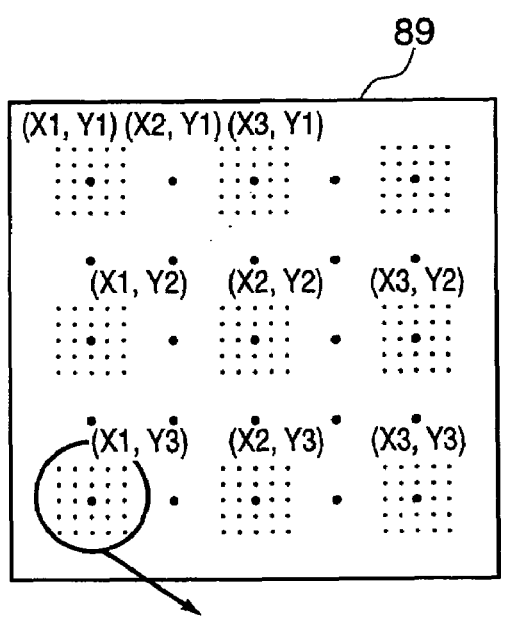
FIG. 6B is an explanatory view of an aperture pattern for aberration measurement in the aperture array of the electron beam lithography machine to which the aberration adjusting method of the charged particle beam optical system in the lithography machine according to the embodiment of the present invention is applied.
Figure 6B:
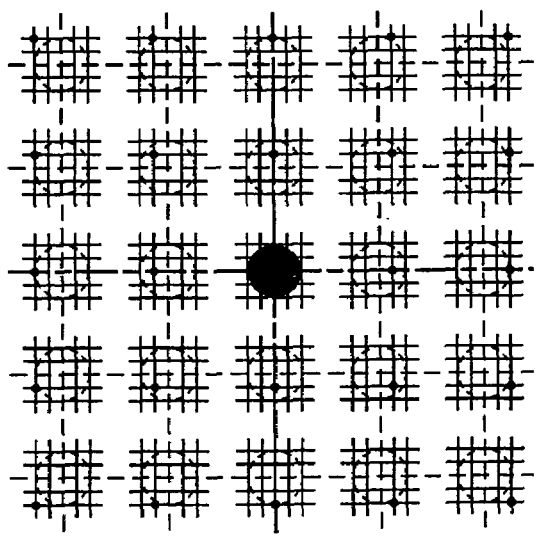
Figure 7B:
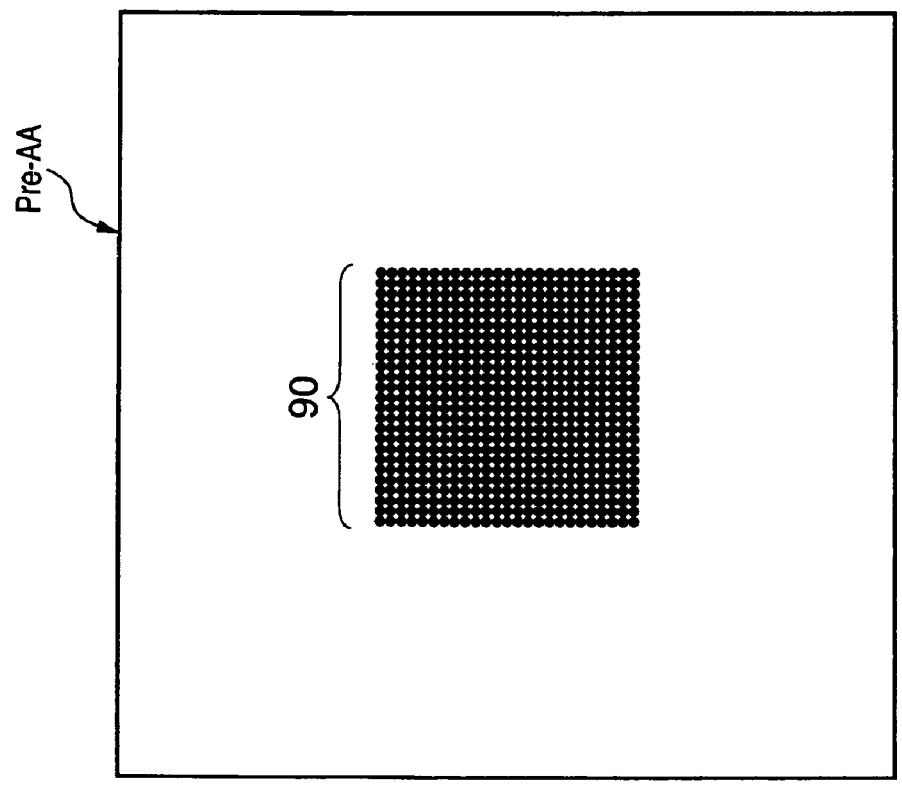
FIG. 7B is an explanatory view of the pre-aperture array of the electron beam lithography machine to which the aberration adjusting method of the charged particle beam optical system in the lithography machine according to the embodiment of the present invention is applied.
Figure 7A:
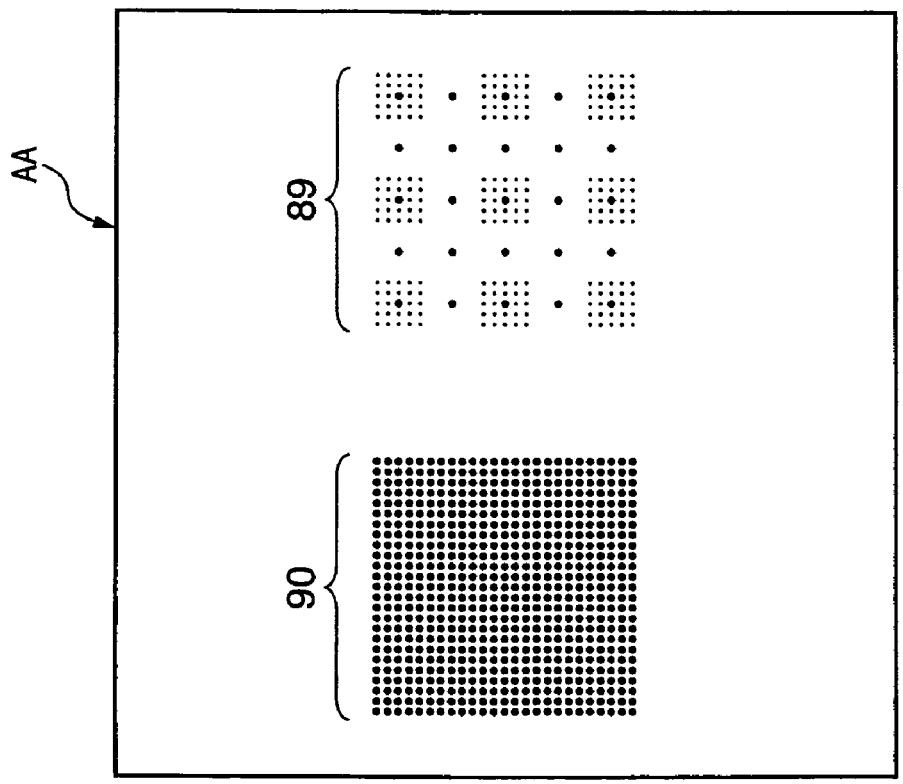
FIG. 7A is an explanatory view of the aperture array of the electron beam lithography machine to which the aberration adjusting method of the charged particle beam optical system in the lithography machine according to the embodiment of the present invention is applied.

In the aperture array AA shown in FIG. 1, the aperture pattern 90 for exposure shown in FIG. 6A and the aperture pattern 89 for aberration measurement shown in FIG. 6B are formed adjacent to one another, as shown in FIG. 7A.

The pre-aperture array Pre-AA shown in FIG. 7B is provided immediately above the aperture array AA. In the aperture pattern 90 for exposure of the pre-aperture array Pre-AA, apertures larger than those for exposure are formed in the same pattern, as described above. In aberration measurement, the aperture array AA is moved so that the aperture pattern 89 for aberration measurement is arranged immediately under the aperture pattern of the pre-aperture array Pre-AA.

Figure 8A:
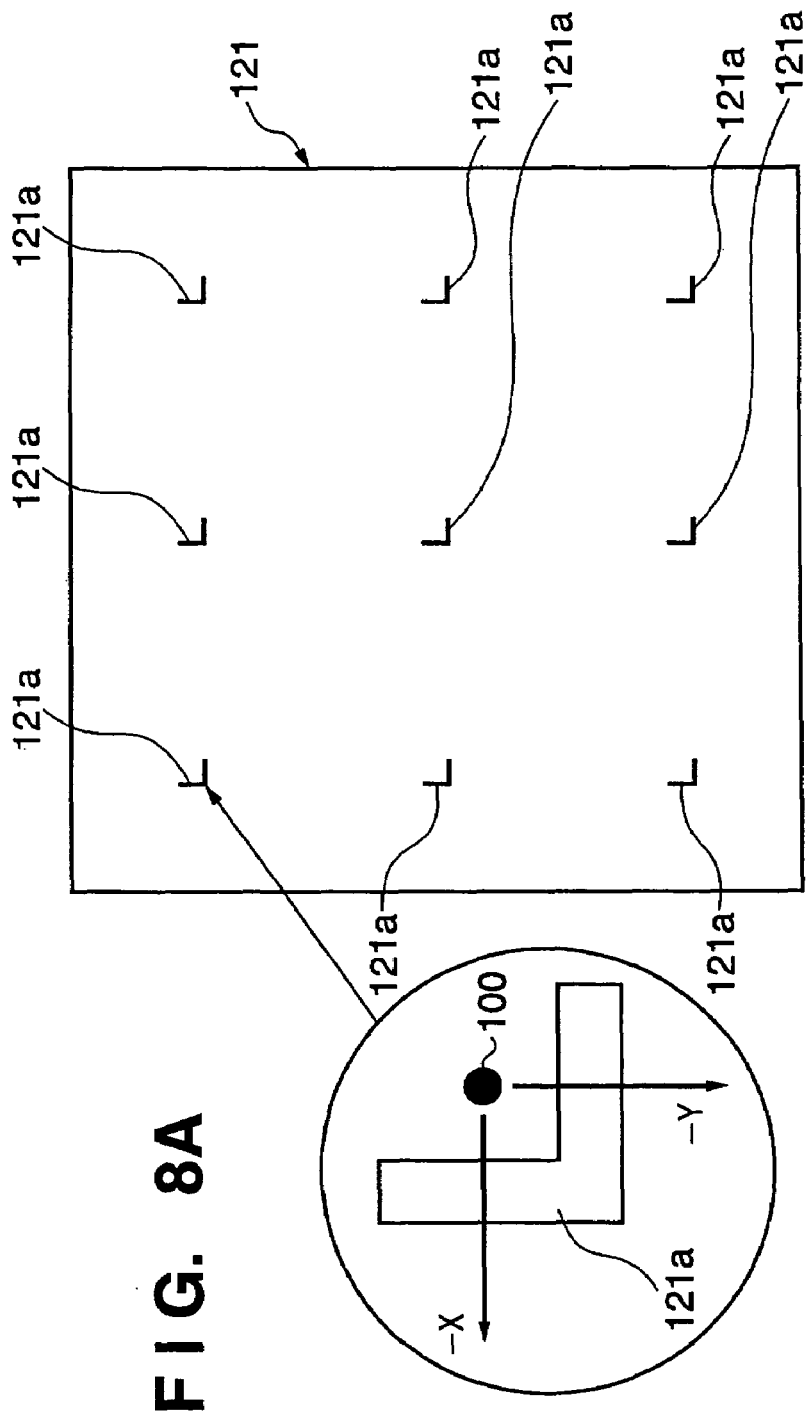
FIG. 8A is a plan view for explaining a semiconductor detector according to the first embodiment of the present invention.
Figure 8B:
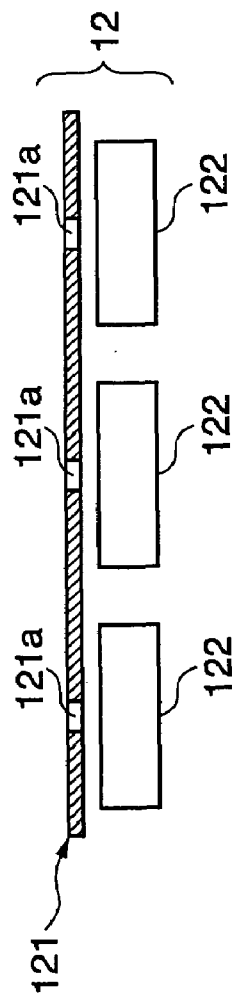
FIG. 8B is a sectional view for explaining the semiconductor detector according to the first embodiment of the present invention.

The semiconductor detector 12 applied to the aberration adjusting method of the charged particle beam optical system in the lithography machine according to the first embodiment of the present invention, which is used in aberration measurement, will be described next with reference to FIGS. 8A and 8B.

The semiconductor detector 12 includes a substrate 121 having a plurality of apertures 121a, and semiconductor devices 122 (e.g., PIN photodiodes or avalanche diodes) corresponding to the apertures 121a of the substrate 121.

Each aperture 121a of the substrate 121 is formed in correspondence with the aperture located at the center of nine blocks of the aperture pattern 89 for aberration measurement shown in FIGS. 6B and 7A. The aperture 121a has an L-shape, as shown in FIG. 8A. When the electron beams 100 are scanned by a main deflector (not shown), and the electron beams 100, which have passed through the apertures 121a, are detected by the semiconductor devices 122, the beam positions in the scanning direction can be detected on the basis of the signals from the semiconductor devices 122 and the positions of the apertures 121a.

Figure 9:
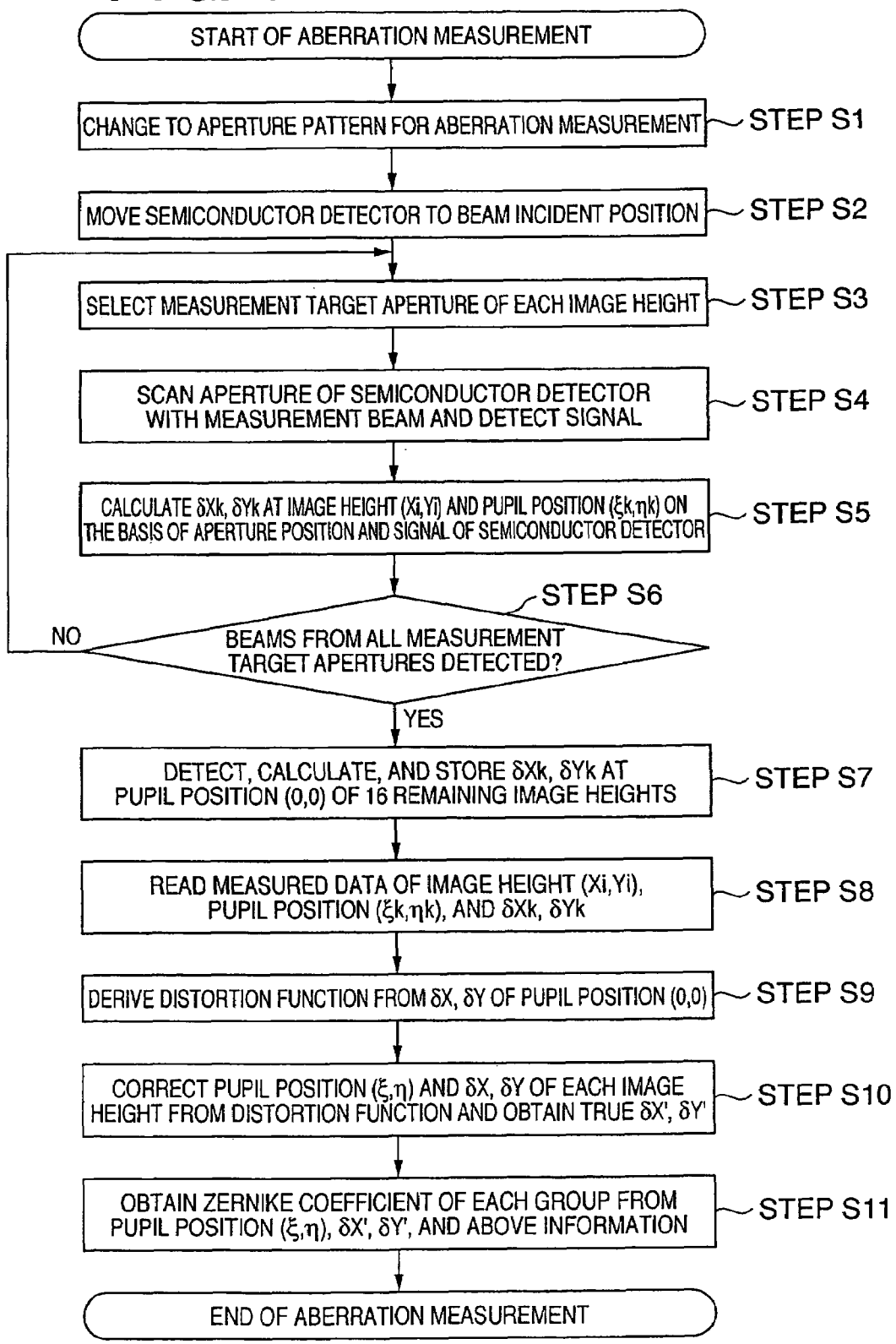
FIG. 9 is an explanatory view of the aberration measuring operation in the aberration adjusting method of the charged particle beam optical system in the lithography machine according to the embodiment of the present invention.

The aberration measuring operation in the electron beam lithography machine to which the aberration adjusting method of the charged particle beam optical system in the lithography machine according to the first embodiment of the present invention is applied will be described next with reference to FIGS. 1 and 2 and, particularly, FIG. 9.

Figure 2:
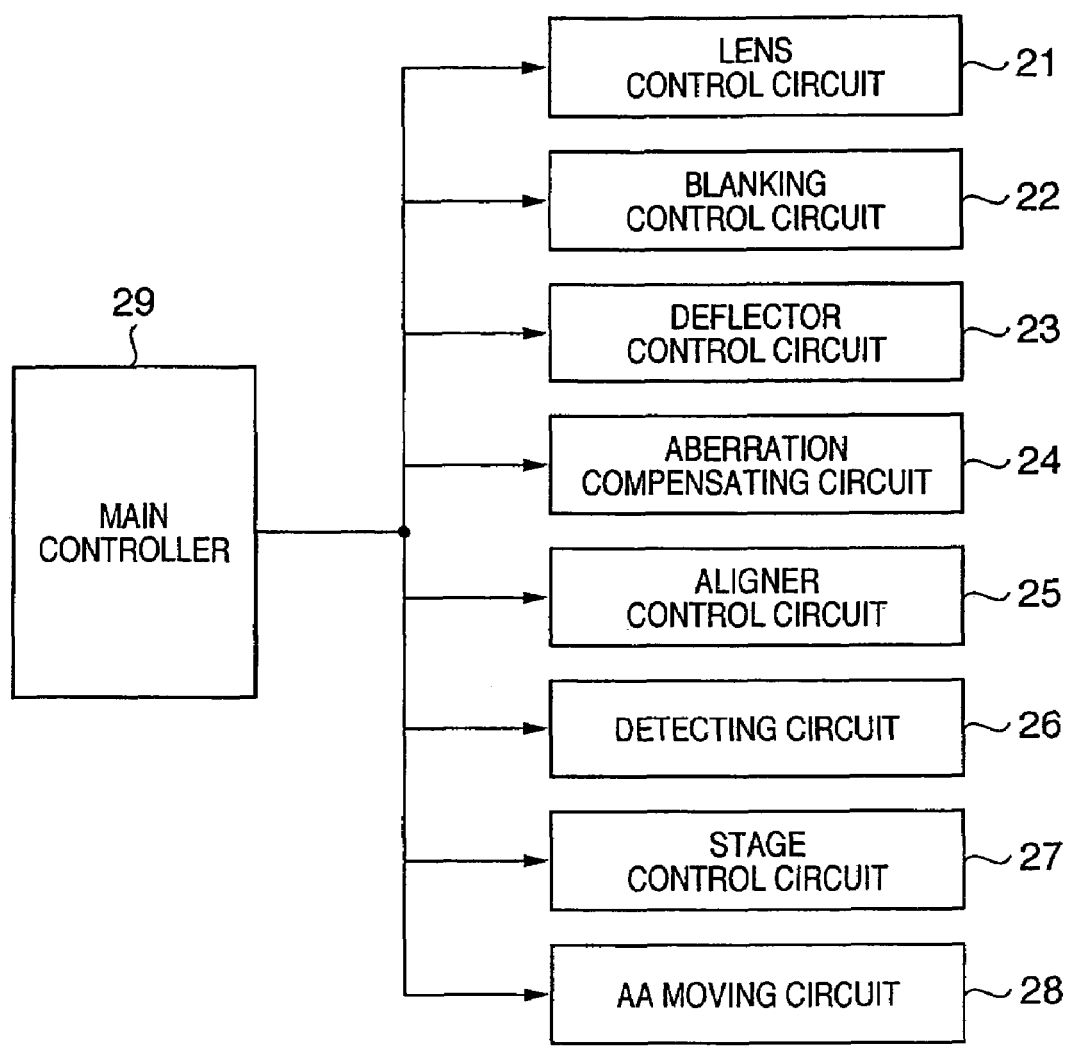
FIG. 2 is a block diagram showing the system configuration of the electron beam lithography machine to which the aberration adjusting method of the charged particle beam optical system in the lithography machine according to the embodiment of the present invention is applied.

For aberration measurement of the lithography machine, the main controller 29 shown in FIG. 2 executes steps S1 to S11.

(Step S1) The main controller 29 instructs the AA moving circuit 28 to move the aperture pattern 89 for aberration measurement of the aperture array AA shown in FIG. 6B immediately under the pre-aperture array Pre-AA.

(Step S2) The main controller 29 instructs the stage control circuit 27 to move the nine apertures of the semiconductor detector 12 to positions where the electron beams 100 from apertures corresponding to the pupil positions (0, 0) of the nine blocks (image heights) of the aperture pattern 89 for aberration measurement strike.

Figure 10B:
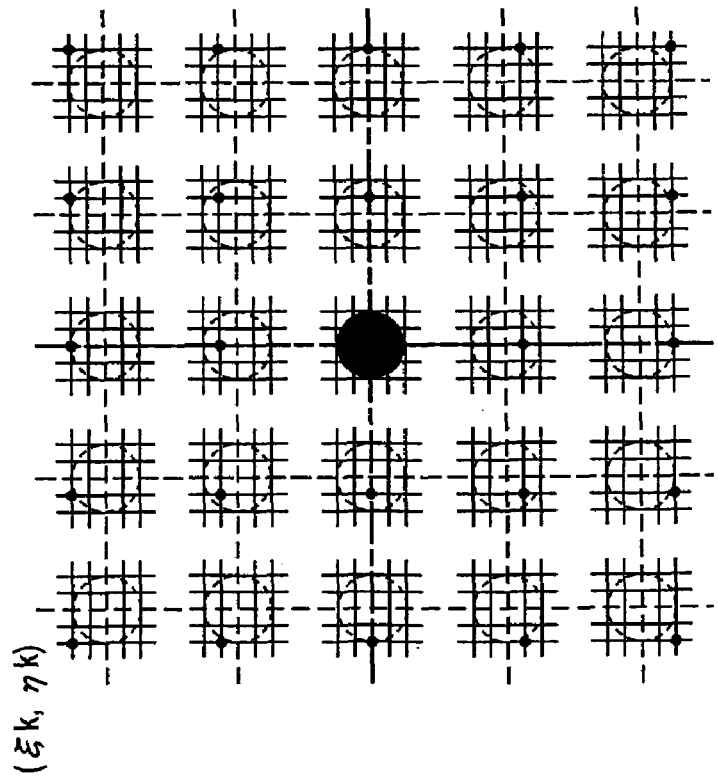
FIG. 10B is a view for explaining an image position in the electron beam lithography machine to which the aberration adjusting method of the charged particle beam optical system in the lithography machine according to the embodiment of the present invention is applied.
Figure 10A:
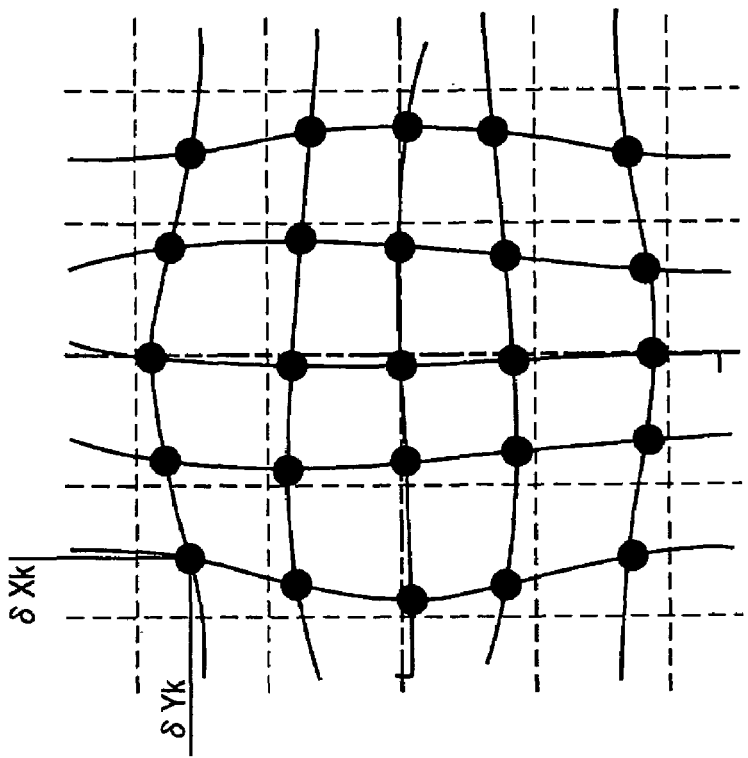
FIG. 10A is a view for explaining an aperture for aberration measurement in the electron beam lithography machine to which the aberration adjusting method of the charged particle beam optical system in the lithography machine according to the embodiment of the present invention is applied.

(Step S3) The main controller 29 instructs the stage control circuit 27 to select an aperture for aberration measurement corresponding to the pupil position (ξk, ηk) of each image height shown in FIG. 10A and input only the electron beam 100 from the aperture for aberration measurement to the semiconductor detector 12.

(Step S4) The main controller 29 instructs the deflector control circuit 23 to scan the selected electron beam 100 on the semiconductor detector 12 and also instructs the detecting circuit 26 to store the signal from the semiconductor detector 12.

(Step S5) On the basis of the aperture positions of the semiconductor detector 12, which are acquired in advance and the detection signal stored in the detecting circuit 26, the main controller 29 calculates and stores a displacement (δXk, δYk) between the designed image position and the actual image position of the electron beam 100 for each image height (Xi, Yi) and pupil position (ξk, ηk) shown in FIG. 10B.

(Step S6) When the main controller 29 detects beam positions from all the measurement target apertures of the nine image heights, the flow advances to step S7. Otherwise, the flow returns to step S3.

(Step S7) The main controller 29 detects, calculates, and stores δXk and δYk of the pupil position (0, 0) of the sixteen remaining image heights by the same step as that for the nine image heights.

(Step S8) The main controller 29 reads stored displacement (δXk, δYk) for each image height (Xi, Yi) and each pupil position (ξk, ηk).

(Step S9) The main controller 29 obtains a distortion function related to the following image height position (X, Y) by approximation of a function on the basis of δXk, δYk of the pupil position (0, 0) of each image height (Xi, Yi). Although the blocks are regarded as having the same image height, there is a slight distortion difference, which results in an aberration error. The distortion function is obtained to correct the error.

$$\delta Xk = F(X, Y)$$

$$\delta Yk = G(X, Y)$$

(Step S10) From the distortion function, the pupil position (ξ, η) and δXk, δYk of each image height are corrected to obtain δXk', δYk'.

$$\delta Xk' = \delta X - F(X, Y)$$

$$\delta Yk' = \delta Y - G(X, Y)$$

where (X, Y) is the actual image height position of pupil position (ξ, η) of each image height.

(Step S11) On the basis of the pupil position (ξ, η), δXk', δYk' of each image height, the Zernike coefficient of each image height is obtained. The wave aberration W(ρ, θ) can finally be obtained by using the Zernike coefficient Cn and Zernike cylindrical system Zn (ρ, θ).

The aberration adjusting method of the charged particle beam optical system in the lithography machine according to the first embodiment of the present invention will be described below.

The aberration adjusting method of the charged particle beam optical system (reduced optical projecting system PL) will be described on the basis of the aberration (Zernike coefficient Cn) obtained by the above-described aberration measuring method. As the aberration adjusting means of the reduced optical projecting system PL, there are the lens, aligner AL2, Stig meter DS, and focus coil DF of the reduced optical projecting system. When their control amounts are adjusted, aberration can be adjusted. In this embodiment, when eight aberrations (C2 to C9) are present for each image height, there are seventy-two aberrations, for a total of nine image heights. That is, since the number of aberrations to be adjusted is larger than the number of control amounts, the aberration adjusting method is a kind of optimization problem. In this embodiment, a change in each aberration corresponding to a change in one control amount is assumed to be linear. The control amount is decided by handling the optimization problem as a linear programming problem. The linear programming problem is represented by an objective function (2-1) and a conditional expression (2-2).

$$z = \sum_{j=1}^{m} c_j x_j \quad (2\text{-}1)$$

$$\sum_{j=1}^{m} \alpha_{ij} x_j \leq c_j \ (i = 1, \ldots, n) \quad (2\text{-}2)$$

where $\alpha_{ij}$ is the control sensitivity, and $x_j$ is the control variable.

The objective function is a function defined by a linear expression of the control variable. This is a function to be minimized or maximized. The conditional expression is also an equation or inequality expressed by a linear expression of the control variable, and n>M.

In this embodiment, suppose that Ci is the actual aberration, CTi is the target aberration, and Ti is the allowable margin, a residual function ei after adjusting is defined by $$ei = (C_i - CT_i)/T_i. \quad (2\text{-}3)$$

To minimize the maximum absolute value of ei (i=1, ..., n), a dummy variable T(|ei|<T (i=1, ..., n)) is introduced, and formulation to a linear programming problem to minimize T is executed. That is, as indicated by equation (2-4) a linear programming problem is set by defining an objective function to minimize the control variable T and setting conditional expressions (2-5) and (2-6), such that the dummy variable T becomes the threshold value of the residual function after adjustment and a value obtained by reversing the sign. When this problem is solved, the maximum absolute value of the residual after adjustment can be minimized.

$$Z = t \quad (2\text{-}4)$$

$$e_i - \sum_{j=1}^{m} \alpha_{ij} x_j \leq t \ (i = 1, \ldots, n) \quad (2\text{-}5)$$

$$-e_i + \sum_{j=1}^{m} \alpha_{ij} x_j \leq t \ (i = 1, \ldots, n) \quad (2\text{-}6)$$

Figure 11A:
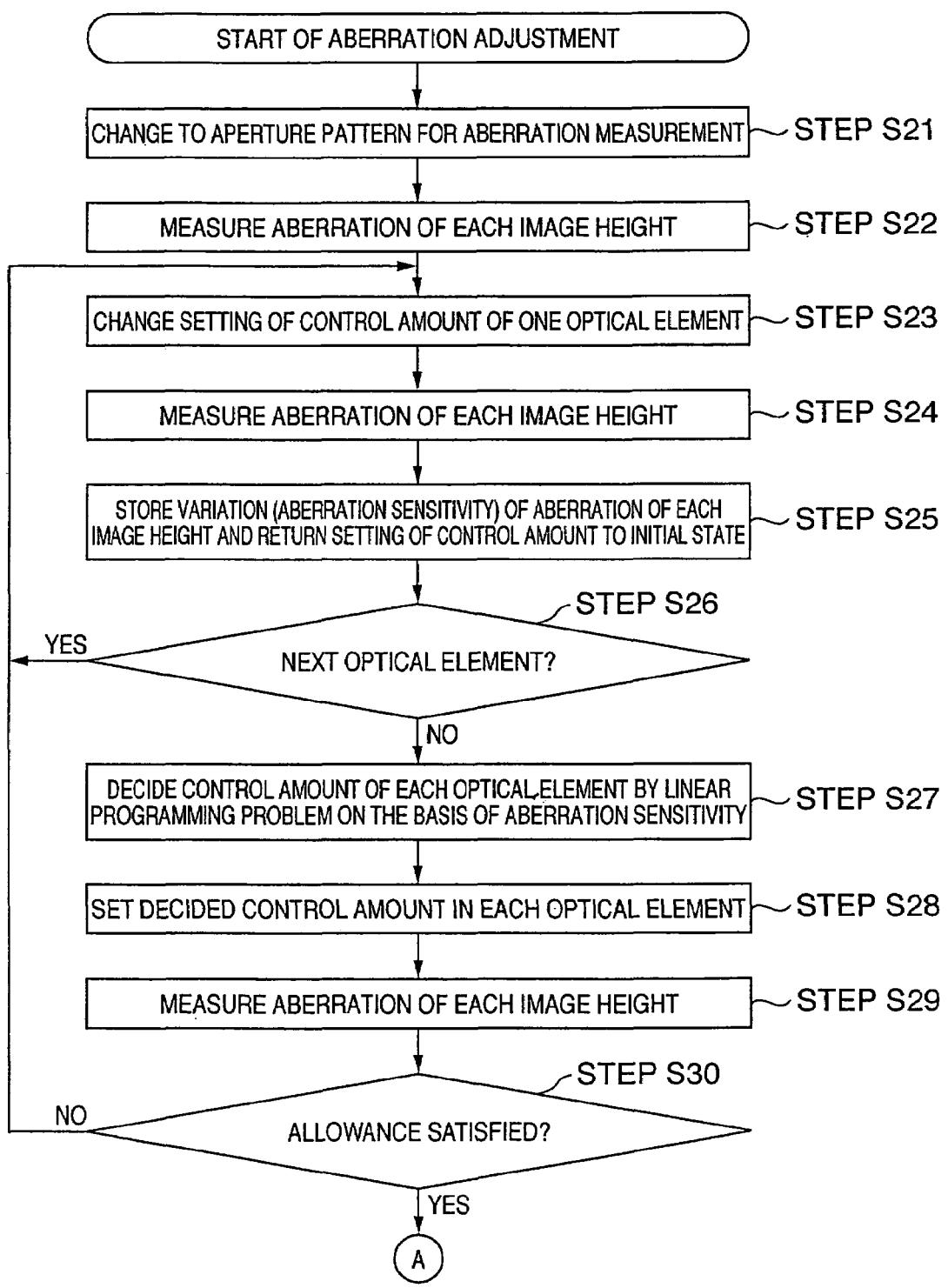
FIG. 11A is an explanatory view of the aberration adjusting method of the charged particle beam optical system in the lithography machine according to the embodiment of the present invention.
Figure 11B:
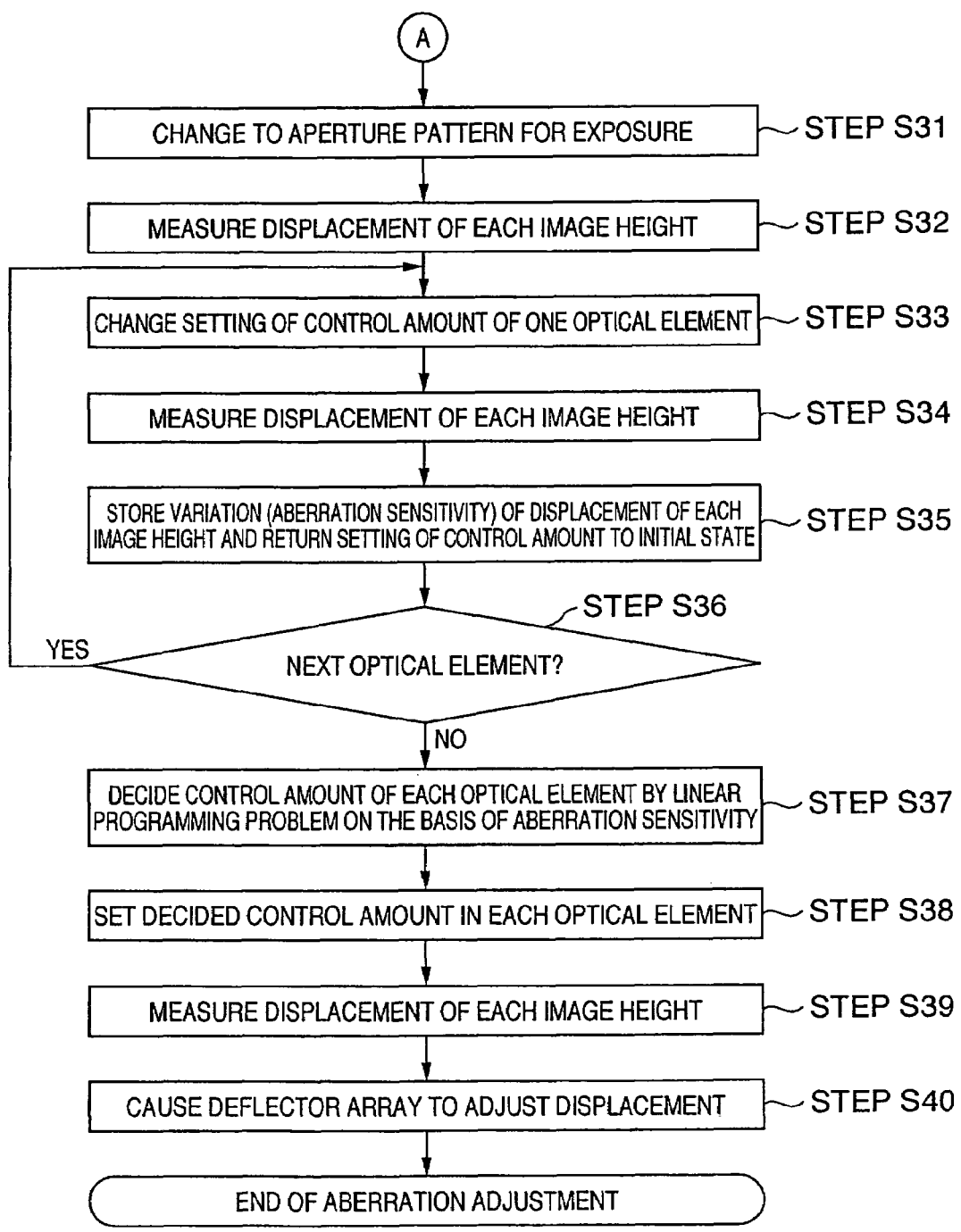
FIG. 11B is an explanatory view of the aberration adjusting method of the charged particle beam optical system in the lithography machine according to the embodiment of the present invention.

The aberration adjusting operation, in the electron beam lithography machine to which the aberration adjusting method of the charged particle beam optical system in the lithography machine according to the first embodiment of the present invention, is applied, will be described next with reference to FIGS. 11A and 11B.

To adjust aberration of the lithography machine, the main controller 29 executes the following steps.

(Step S21) The main controller 29 instructs the AA moving circuit 28 to move the aperture pattern for aberration measurement of the aperture array AA immediately under the pre-aperture array Pre-AA.

(Step S22) The main controller 29 executes measurement in the above-described manner and calculates and stores aberrations (Zernike coefficients C2 to C9) of the nine image heights.

(Step S23) The main controller 29 changes setting of the control amount of one optical element (one of the symmetric magnetic double lenses D1 and D2, Stig meter D2, focus coil DF, and aligner AL2) by a corresponding control circuit.

(Step S24) The main controller 29 executes measurement in the above-described manner and calculates and stores aberrations (Zernike coefficients C2 to C9) of the nine image heights.

(Step S25) The main controller 29 stores the difference (aberration sensitivity) between the aberration in step S24 and that in step S22 and returns the changed control amount setting to the initial state.

(Step S26) If an optical element whose setting is to be changed remains, the main controller 29 returns to step S23. Otherwise, the flow advances to step S28.

(Step S27) As a result of execution of the above steps, the main controller 29 has the aberration sensitivity and target value of each control in Table 2.

TABLE 2

Aberration Sensitivity and Target Value of Each Control

| Image Height Position | Aberration | Aberration Sensitivity | | | Allowable Margin | Target Value |
|---|---|---|---|---|---|---|
| | | Controller 1 | . . | Controller M | | |
| (X1, Y1) | C2 | a111 | . . | a1m1 | T11 | CT11 |
| | C3 | a112 | . . | a1m2 | T12 | CT12 |
| | C4 | a113 | . . | a1m3 | T13 | CT13 |
| | C5 | a114 | . . | a1m4 | T14 | CT14 |
| | C6 | a115 | . . | a1m5 | T15 | CT15 |
| | C7 | a116 | . . | a1m6 | T16 | CT16 |
| | C8 | a117 | . . | a1m7 | T17 | CT17 |
| | C9 | a118 | . . | a1m8 | T18 | CT18 |
| . | . | . | . . | . | . | . |
| (Xj, Yj) | C2 | aj11 | . . | ajm1 | Tj1 | CTj1 |
| | C3 | aj12 | . . | ajm2 | Tj2 | CTj2 |
| | C4 | aj13 | . . | ajm3 | Tj3 | CTj3 |
| | C5 | aj14 | . . | ajm4 | Tj4 | CTj4 |
| | C6 | aj15 | . . | ajm5 | Tj5 | CTj5 |
| | C7 | aj16 | . . | ajm6 | Tj6 | CTj6 |
| | C8 | aj17 | . . | ajm7 | Tj7 | CTj7 |
| | C9 | aj18 | . . | ajm8 | Tj8 | CTj8 |

Controllers 1 to M indicate controllers to control the optical elements (symmetric magnetic doublet lenses D1 and D2, Stig meter DS, focus coil DF, and aligner AL2 circuit). The allowable margin and target value are obtained in advance. The allowable margins of beam displacements (distortions) C2 and C3 are set to values twice to four times the original values. Details will be described later. On the basis of Table 2 and the above-described linear programming problem, the control amount of each optical element is decided.

(Step S28) The main controller 29 sets the decided control amount in each optical element.

(Step S29) The main controller 29 executes measurement in the above-described manner and calculates and stores aberrations (Zernike coefficients C2 to C9) of the nine image heights.

(Step S30) If the measured aberrations (Zernike coefficients C2 to C9) of the nine image heights do not satisfy the allowance, the flow returns to step S23. Otherwise, the flow advances to the next step.

(Step S31) The main controller 29 instructs the AA moving circuit 28 to move the aperture pattern for exposure of the aperture array AA immediately under the pre-aperture array Pre-AA.

(Step S32) The main controller 29 executes the semiconductor detector 12 to measure the positions of 25×25 beams or selected 9×9 beams.

(Step S33) The main controller 29 changes setting of the control amount of one of the optical elements (one of the beam shaping optical systems 2 and 3, collimating lens 4, Stig meter STG, and aligner AL1) by a corresponding control circuit. These optical elements influence only beam displacement (distortion). In the subsequent steps, the beam displacement (distortion) is accurately adjusted. Hence, beam displacement (distortion) adjustment in adjusting the aberrations (Zernike coefficients C2 to C9) is coarse.

(Step S34) The main controller 29 causes the semiconductor detector 12 to measure the positions of 25×25 beams or selected 9×9 beams, as in step S32.

(Step S35) The main controller 29 stores the difference (aberration sensitivity) between the displacement amount in step S33 and that in step S32 and returns the changed control amount setting to the initial state.

(Step S36) If an optical element whose setting is to be changed remains, the main controller 29 returns to step S33. Otherwise, the flow advances to step S37.

(Step S37) The main controller 29 decides the control amount of each optical element by the linear programming problem on the basis of the obtained aberration sensitivity (only displacement).

(Step S38) The main controller 29 sets the decided control amount in each optical element.

(Step S39) The main controller 29 causes the semiconductor detector 12 to measure the positions of 25×25 beams or selected 9×9 beams, as in step S32.

(Step S40) The main controller 29 causes the deflector array to adjust the remaining displacement.

A device fabrication method by the lithography machine of the embodiment of the present invention using the electron beam lithography machine will be described below.

Figure 12:
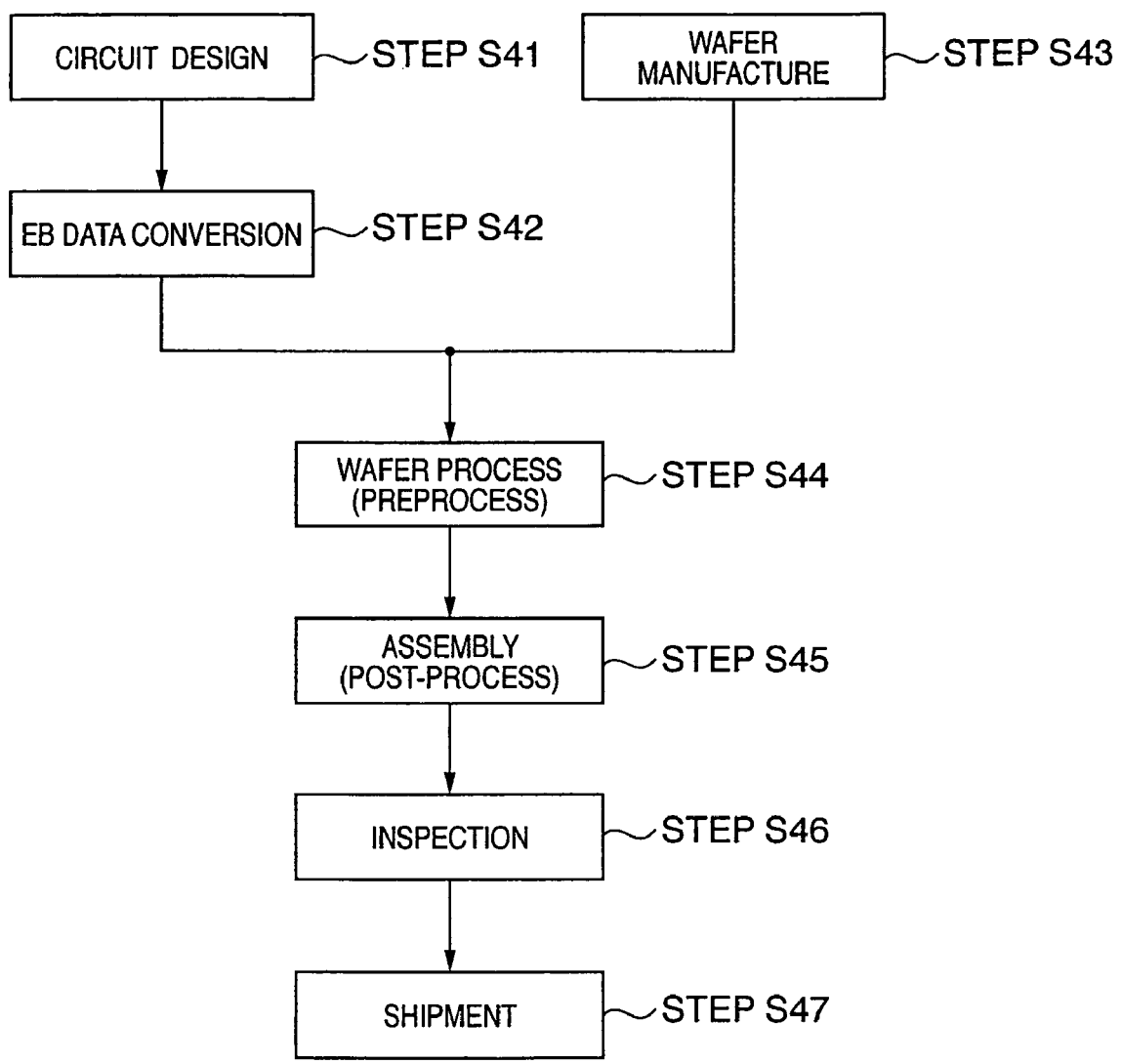
FIG. 12 is an explanatory view of the flow of a device fabrication method by the lithography machine according to the embodiment of the present invention.

In the device fabrication method by the lithography machine of the embodiment of the present invention, a device is fabricated by a lithography machine to which the aberration adjusting method of the charged particle beam optical system in the lithography machine is supplied. FIG. 12 shows the flow of fabrication of a micro device (e.g., a semiconductor chip, such as an IC or LSI, a liquid crystal panel, a CCD, a thin-film magnetic head, or a micromachine).

In step S41 (circuit design), the circuit of a semiconductor device is designed.

In step S42 (exposure control data creation), exposure control data of the lithography machine is created on the basis of the designed circuit pattern.

In step S43 (wafer manufacture), a wafer is manufactured by using a material such as silicon.

In step S44 (wafer process), called a preprocess, an actual circuit is formed on the wafer by lithography using the wafer and the lithography machine to which the prepared exposure control data is input.

In step S45 (assembly), called a post-process, a semiconductor chip is formed from the wafer prepared in step S44. This step includes processes such as assembly (dicing and bonding) and packaging (chip encapsulation).

In step S46 (inspection), inspections including an operation check test and a durability test of the semiconductor device prepared in step S45 are performed.

A semiconductor device is completed with these processes and shipped (step S47).

Figure 13:
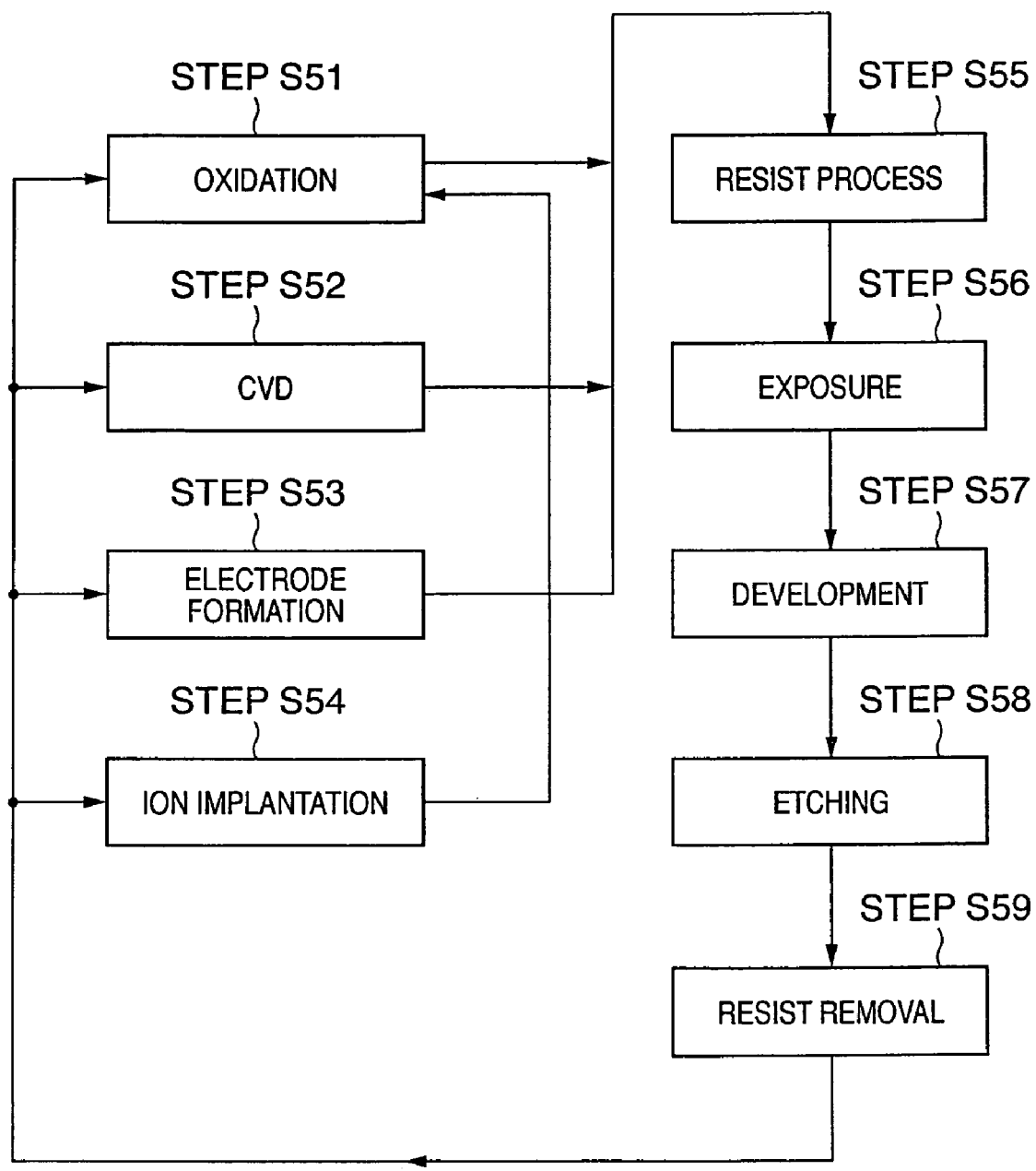
FIG. 13 is an explanatory view of a wafer process in the device fabrication method by the lithography machine according to the embodiment of the present invention.

The wafer process in step S44 in FIG. 12 will be described next in detail with reference to FIG. 13.

In step S51 (oxidation), the surface of the wafer is oxidized.

In step S52 (CVD), an insulating film is formed on the wafer surface.

In step S53 (electrode formation), an electrode is formed on the wafer by deposition.

In step S54 (ion implantation), ions are implanted into the wafer.

In step S55 (resist process), a photosensitizer is applied to the wafer.

In step S56 (exposure), the circuit pattern is printed on the wafer by exposure using the above-described lithography machine.

In step S57 (development), the exposed wafer is developed.

In step S58 (etching), portions other than the developed resist image are etched.

In step S59 (resist removal), any unnecessary resist remaining after etching is removed.

By repeating these steps, a multilayered structure of circuit patterns is formed on the wafer.

According to the device fabrication method by the lithography machine of the embodiment of the present invention, a highly integrated semiconductor device, which is conventionally hard to fabricate, can be fabricated at a low cost.

As many apparently widely different embodiments of the present invention can be made without departing from the spirit and scope thereof, it is to be understood that the invention is not limited to the specific embodiments thereof except as defined in the appended claims.

This application claims the benefit of Japanese Patent Application No. 2005-018284, filed on Jan. 26, 2005, which is hereby incorporated by reference herein in its entirety.

What is claimed is:

1. An aberration adjusting method of a charged particle beam optical system, said method comprising:
   an aberration measuring step of measuring N aberrations of the charged particle beam optical system;
   an aberration sensitivity acquiring step of changing M control amounts to control optical elements included in the charged particle beam optical system, obtaining variations of the N aberrations by executing the aberration measuring step, and obtaining aberration sensitivities of the M control amounts; and
   a control amount deciding step of deciding the M control amounts on the basis of the N aberrations and the aberration sensitivities of the M control amounts to set the N aberrations to target aberrations,
   wherein the aberration is a displacement of each image height of charged particles beams,
   the control amount is an amount for controlling a position of the charged particle beams, and
   M<N, in which M and N are positive integers.

2. The method according to claim 1, further comprising an aberration confirming step of executing the aberration measuring step again after the control amounts decided in the control amount deciding step are set in the optical elements.

3. The method according to claim 2, wherein if the aberrations do not satisfy allowances in the aberration confirming step, the aberration sensitivity acquiring step, the control amount deciding step, and the aberration confirming step are executed again.

4. The method according to claim 1, wherein the aberration is represented by a Zernike coefficient.

5. The method according to claim 1, wherein, in the control amount deciding step,
   suppose that $Ci$ is the aberration, $CTi$ is the target aberration, and $Ti$ is the allowance, a residual function $ei$ after adjustment is defined by:

$$ei=(Ci-CTi)/Ti,$$

to minimize a maximum absolute value of the residual function $ei$ after adjustment ($i=1, \ldots, n$), a dummy variable $T(|ei|)<T$ ($i=1, \ldots, n$)) is introduced, formulation to a linear programming problem to minimize the dummy variable $T$ is executed, and, on the basis of the aberration sensitivity, the control amounts to control the optical elements are decided.

6. A device fabrication method comprising:
   fabricating a device by using an aberration adjusting method of claim 1.

7. A charged particle beam lithography machine for exposing a substrate through a charged particle beam optical system, said machine comprising:
   an aberration measuring unit adapted to measure N aberrations of the charged particle beam optical system;
   an aberration sensitivity acquiring unit adapted to change M control amounts to control optical elements included in the charged particle beam optical system, to obtain variations of the N aberrations by using said aberration measuring unit, and to obtain aberration sensitivities of the M control amounts; and
   a control amount deciding unit adapted to decide the M control amounts on the basis of the N aberrations and the aberration sensitivities of the M control amounts to set the N aberrations to target aberrations,
   wherein the aberration is a displacement of each image height of charged particles beams,
   the control amount is an amount for controlling a position of the charged particle beams, and
   M<N, in which M and N are positive integers.

8. A device fabrication method comprising steps of:
   exposing a target exposure substrate by using a charged particle beam lithography machine of claim 7; and
   developing the exposed substrate.

* * * * *